(12) United States Patent
Gold

(10) Patent No.: US 11,851,763 B2
(45) Date of Patent: Dec. 26, 2023

(54) CHEMICAL VAPOR DEPOSITION DURING ADDITIVE MANUFACTURING

(71) Applicant: GENERAL ELECTRIC COMPANY, Schenectady, NY (US)

(72) Inventor: Scott Alan Gold, Waynesville, OH (US)

(73) Assignee: General Electric Company, Schenectady, NY (US)

(*) Notice: Subject to any disclaimer, the term of this patent is extended or adjusted under 35 U.S.C. 154(b) by 416 days.

(21) Appl. No.: 15/631,955

(22) Filed: Jun. 23, 2017

(65) Prior Publication Data
US 2018/0369912 A1  Dec. 27, 2018

(51) Int. Cl.
*B22F 7/04* (2006.01)
*C23C 16/50* (2006.01)
(Continued)

(52) U.S. Cl.
CPC .............. *C23C 16/50* (2013.01); *B22F 7/02* (2013.01); *B22F 7/04* (2013.01); *B22F 7/06* (2013.01); *B22F 10/14* (2021.01); *B22F 10/28* (2021.01); *B22F 10/50* (2021.01); *B22F 10/62* (2021.01); *B22F 12/49* (2021.01); *B22F 12/67* (2021.01); *B22F 12/70* (2021.01); *B23K 15/0086* (2013.01); *B23K 26/082* (2015.10); *B23K 26/342* (2015.10); *B28B 1/001* (2013.01); *B29C 64/153* (2017.08); *B29C 64/165* (2017.08); *B29C 64/20* (2017.08); *B33Y 10/00* (2014.12); *B33Y 30/00* (2014.12); *B33Y 40/00* (2014.12); *B33Y 40/20* (2020.01); *C23C 16/04* (2013.01); *C23C 16/52* (2013.01); *B22F 3/24* (2013.01);
(Continued)

(58) Field of Classification Search
CPC .... B22F 3/008; B22F 3/1055; B23K 15/0086; B23K 26/082; B23K 26/342; B28B 1/001; B29C 64/153; B29C 64/165; B29C 64/20; B33Y 10/00; B33Y 30/00; B33Y 40/00; C23C 16/52
See application file for complete search history.

(56) References Cited

U.S. PATENT DOCUMENTS

| | | |
|---|---|---|
| 3,565,676 A | 2/1971 | Holzl |
| 3,594,216 A | 7/1971 | Charles et al. |

(Continued)

FOREIGN PATENT DOCUMENTS

| | | |
|---|---|---|
| CN | 104783929 A | 7/2015 |
| CN | 206033873 U | 3/2017 |
| WO | WO2016/046221 A1 | 3/2016 |

OTHER PUBLICATIONS

ASM Handbook, vol. 5: Surface Engineering C.M. Cotell, J.A. Sprague, and F.A. Smidt, Jr., editors, p. 532-537 DOI: 10.31399/asm.hb.v05.a0001285 p. 532-537 (Year: 1994).*

(Continued)

*Primary Examiner* — Nicholas A Wang
(74) *Attorney, Agent, or Firm* — Dinsmore & Shohl LLP

(57) ABSTRACT

The present disclosure generally relates to methods and apparatuses for chemical vapor deposition (CVD) during additive manufacturing (AM) processes. Such methods and apparatuses can be used to embed chemical signatures into manufactured objects, and such embedded chemical signatures may find use in anti-counterfeiting operations and in manufacture of objects with multiple materials.

20 Claims, 11 Drawing Sheets

(51) Int. Cl.

| | | |
|---|---|---|
| *B33Y 10/00* | (2015.01) | |
| *B33Y 30/00* | (2015.01) | |
| *B28B 1/00* | (2006.01) | |
| *B33Y 40/00* | (2020.01) | |
| *C23C 16/04* | (2006.01) | |
| *C23C 16/52* | (2006.01) | |
| *B23K 15/00* | (2006.01) | |
| *B23K 26/342* | (2014.01) | |
| *B23K 26/082* | (2014.01) | |
| *B29C 64/153* | (2017.01) | |
| *B22F 7/06* | (2006.01) | |
| *B29C 64/165* | (2017.01) | |
| *B29C 64/20* | (2017.01) | |
| *B22F 7/02* | (2006.01) | |
| *B33Y 40/20* | (2020.01) | |
| *B22F 10/14* | (2021.01) | |
| *B22F 10/28* | (2021.01) | |
| *B22F 12/49* | (2021.01) | |
| *B22F 12/67* | (2021.01) | |
| *B22F 12/70* | (2021.01) | |
| *B22F 10/50* | (2021.01) | |
| *B22F 10/62* | (2021.01) | |
| *B22F 3/24* | (2006.01) | |
| *B22F 12/00* | (2021.01) | |
| *B22F 10/36* | (2021.01) | |
| *B22F 10/64* | (2021.01) | |

(52) U.S. Cl.
CPC ............. *B22F 10/36* (2021.01); *B22F 10/64* (2021.01); *B22F 12/224* (2021.01); *B22F 2003/242* (2013.01); *B22F 2999/00* (2013.01)

(56) References Cited

U.S. PATENT DOCUMENTS

| | | | |
|---|---|---|---|
| 3,656,995 A | 4/1972 | Reedy, Jr. | |
| 5,183,685 A | 2/1993 | Yamazaki | |
| 5,241,245 A | 8/1993 | Barnes et al. | |
| 5,304,282 A | 4/1994 | Flamm | |
| 5,387,380 A | 2/1995 | Cima et al. | |
| 5,656,329 A | 8/1997 | Hampden-Smith et al. | |
| 5,676,758 A * | 10/1997 | Hasegawa | C23C 16/455 118/723 E |
| 6,118,377 A * | 9/2000 | Bonkowski | G07D 7/023 283/70 |
| 6,289,842 B1 * | 9/2001 | Tompa | H01J 37/32522 118/723 R |
| 6,475,902 B1 | 11/2002 | Hausmann et al. | |
| 6,492,651 B2 | 12/2002 | Kerekes | |
| 6,548,899 B2 | 4/2003 | Ross | |
| 6,743,473 B1 | 6/2004 | Parkhe et al. | |
| 6,861,613 B1 | 3/2005 | Meiners et al. | |
| 7,045,738 B1 | 5/2006 | Kovacevic et al. | |
| 7,148,448 B2 | 12/2006 | Warren et al. | |
| 7,217,102 B2 | 5/2007 | Rockstroh et al. | |
| 7,585,450 B2 | 9/2009 | Wahlstrom et al. | |
| 7,621,733 B2 | 11/2009 | Reynolds et al. | |
| 7,690,909 B2 | 4/2010 | Wahlstrom | |
| 7,850,885 B2 | 12/2010 | Philippi et al. | |
| 8,017,055 B2 | 9/2011 | Davidson et al. | |
| 8,222,567 B2 | 7/2012 | Mathai et al. | |
| 8,506,836 B2 | 8/2013 | Szuromi et al. | |
| 9,126,167 B2 | 9/2015 | Ljungblad | |
| 2002/0017743 A1 * | 2/2002 | Priedeman, Jr. | B29C 64/106 264/464 |
| 2002/0076897 A1 * | 6/2002 | Peterson | H01L 23/544 438/401 |
| 2002/0106412 A1 | 8/2002 | Rowe et al. | |
| 2002/0122885 A1 * | 9/2002 | Ahn | C23C 16/45589 427/255.28 |
| 2008/0241404 A1 | 10/2008 | Allaman et al. | |
| 2009/0286007 A1 | 11/2009 | Brancher et al. | |
| 2010/0024729 A1 * | 2/2010 | Cao | C23C 16/45563 118/723 E |
| 2010/0028238 A1 * | 2/2010 | Maschwitz | H01J 37/32036 315/111.41 |
| 2013/0323422 A1 * | 12/2013 | Peidous | C23C 16/405 427/255.7 |
| 2014/0265049 A1 | 9/2014 | Burris et al. | |
| 2014/0308153 A1 | 10/2014 | Ljungblad | |
| 2014/0361464 A1 | 12/2014 | Holcomb | |
| 2015/0177158 A1 | 6/2015 | Cheverton | |
| 2015/0290881 A1 | 10/2015 | Ederer et al. | |
| 2015/0367415 A1 * | 12/2015 | Buller | B23K 26/346 419/53 |
| 2016/0067779 A1 | 3/2016 | Dautova et al. | |
| 2016/0067828 A1 * | 3/2016 | Liebl | B22F 3/1055 427/551 |
| 2016/0271874 A1 * | 9/2016 | Tsai | B33Y 10/00 |
| 2016/0311164 A1 | 10/2016 | Miyano | |
| 2017/0306221 A1 | 10/2017 | Koole et al. | |

OTHER PUBLICATIONS

"Definition of 'nozzle'". Collins dictionary. Retrieved from: https://www.collinsdictionary.com/us/dictionary/english/nozzle. Oct. 2019. (Year: 2019).*

Gujba et al., "Laser Peening Process and Its Impact on Materials Properties in Comparison with Shot Peening and Ultrasonic Impact Peening," Materials, 2014, vol. 7, pp. 7925-7974.

Peyre et al., "Laser shock processing: a review of the physics and applications," Optical and Quantum Electronics, vol. 27, 1995, pp. 1213-1229.

Chinese Office Action and Search Report Corresponding to Application No. 201810658822 dated May 13, 2020.

* cited by examiner

CHEMICAL VAPOR DEPOSITION DURING ADDITIVE MANUFACTURING

INTRODUCTION

The present disclosure generally relates to methods and apparatuses for chemical vapor deposition (CVD) during additive manufacturing (AM) processes. Most commercially available AM machines can be used to build components of only a single material. The methods and systems of the present disclosure may be used to integrate a secondary material would allow additional or improved functionality of many AM components, and allow addition of chemical signatures while making various objects, including components having polymerized inner core portions and well defined outer surfaces, and in processes utilizing these components.

BACKGROUND

Additive manufacturing (AM) or additive printing processes generally involve the buildup of one or more materials to make a net or near net shape (NNS) object, in contrast to subtractive manufacturing methods. Though "additive manufacturing" is an industry standard term (ASTM F2792), AM encompasses various manufacturing and prototyping techniques known under a variety of names, including freeform fabrication, 3D printing, rapid prototyping/tooling, etc. AM techniques are capable of fabricating complex components from a wide variety of materials. Generally, a freestanding object can be fabricated from a computer aided design (CAD) model. A particular type of AM process uses electromagnetic radiation such as a laser beam, to melt or sinter a powdered material, creating a solid three-dimensional object.

An example of an apparatus for AM using a powdered build material is shown in FIG. 1. The apparatus 140 builds objects or portions of objects, for example, the object 152, in a layer-by-layer manner by sintering or melting a powder material (not shown) using an energy beam 170 generated by a source 150, which can be, for example, a laser for producing a laser beam, or a filament that emits electrons when a current flows through it. The powder to be melted by the energy beam is supplied by reservoir 156 and spread evenly over a powder bed 142 using a recoater arm 146 travelling in direction 164 to maintain the powder at a level 148 and remove excess powder material extending above the powder level 148 to waste container 158. The energy beam 170 sinters or melts a cross sectional layer of the object being built under control of an irradiation emission directing device, such as a laser galvo scanner 162. The galvo scanner 162 may comprise, for example, a plurality of movable mirrors or scanning lenses.

The speed at which the energy beam is scanned is a critical controllable process parameter, impacting the quantity of energy delivered to a particular spot. Typical energy beam scan speeds are on the order of 10 to 1000 millimeters per second. The build platform 144 is lowered and another layer of powder is spread over the powder bed and object being built, followed by successive melting/sintering of the powder by the laser 150. The powder layer is typically, for example, 10 to 100 microns in thickness. The process is repeated until the object 152 is completely built up from the melted/sintered powder material. The energy beam 170 may be controlled by a computer system including a processor and a memory (not shown). The computer system may determine a scan pattern for each layer and control energy beam 170 to irradiate the powder material according to the scan pattern. After fabrication of the object 152 is complete, various post-processing procedures may be applied to the object 152. Post-processing procedures include removal of excess powder by, for example, blowing or vacuuming. Other post processing procedures include a stress relief heat treat process. Additionally, thermal and chemical post processing procedures can be used to finish the object 152.

Most commercial AM machines allow components to be built from only a single component material. For example, powder bed 142 and powder reservoir 156 of the system illustrated in FIG. 1 allow for only a single powder material feedstock to be used to fabricate a component. Incorporation of one or more additional materials into the component may be desirable in many cases. For example, coatings could be added to a component during the additive process for wear or chemical resistance eliminating the need for a post process operation. With rapid maturation of AM technology, more accurate printers and modeling tools may become available at decreasing cost. Accordingly, inexpensive replicas of objects may flood the market, and such replicas may be of inferior quality compared to the original, genuine part. However, neither the consumer nor the manufacturer may be able to distinguish originals from replicas upon simple visual inspection of the intact object. Therefore, it is desirable to be able to chemically or physically mark parts—on or below the surface—during AM processes with distinct signatures, to help consumers and manufacturers alike tell apart original, genuine parts from inexpensive, inferior replicas.

SUMMARY

The following presents a simplified summary of one or more aspects of the present disclosure in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

In one aspect, the present disclosure relates to a method for fabricating an object, comprising (a) fusing at least a portion of a given layer of build material to form at least one fused region; (b) providing a subsequent layer of build material; (c) repeating steps (a) and (b) until the object is formed; and (d) at least one step of depositing a second material by chemical vapor deposition during or after forming the object. In some aspects, fusing at least a portion of a given layer of build material comprises solidifying the build material. In some aspects, solidifying the build material comprises fusing a metal powder. In some aspects, solidifying the build material comprises polymerizing the build material. In some aspects, the fusing at least a portion of the given layer of build material comprises binder jetting the build material. In some aspects, the build material is a polymer, a ceramic slurry, metallic slurry, or a metal powder. In some aspects, the second material is more opaque to x-ray radiation, more opaque to radioactivity, has a different absorbance energy than the build material in the solidified state as measured by computed tomography (CT) scanning, has different mechanical wear properties, has greater corrosion resistance, has different infrared (IR) emissivity, has different IR absorptivity or reflectivity, has different ultraviolet (UV) absorptivity or reflectivity, has a different secondary x-ray emission energy profile, has a different neutron scattering profile, has a different surface energy, has a different coefficient of friction, has a different thermal conductivity, has different acoustic propagation properties, has different fatigue resistance, has different wear resistance, has different tribology, has different electrical conductivity, or has different surface properties than the build material in the fused state. In some aspects, the second material has a different density than the build material in the solidified state. In some aspects, the second material has different mechanical wear properties from the build material in the fused state. In some aspects, the second material has greater corrosion resistance than the build material. In some aspects, the second material has different electrical conductivity from the build material. In some aspects, the solidifying uses a laser source. In some aspects, the solidifying uses an electron beam source. In some aspects, the second material is deposited by plasma-enhanced chemical vapor deposition; wherein the plasma is generated and/or strengthened by at least one selected from two or more arc electrodes, a helical resonator, or an electron cyclotron resonance plasma reactor. In some aspects, at step (d), a vapor is released, wherein the vapor is contained or released at no more than 15 cm from the at least a portion of one or more of the layers of build material.

In another aspect, the present disclosure relates to an apparatus for additive manufacturing, comprising: at least one fusing source for fusing a build material; and a chemical vapor deposition (CVD) unit movable in at least two dimensions. In some aspects, the fusing source is an electron beam source. In some aspects, the fusing source is a laser source. In some aspects, the fusing source is configured for binder jetting. In some aspects, the CVD unit comprises: at least one plasma source selected from two or more arc electrodes, a helical resonator, or an electron cyclotron resonance plasma reactor; at least one gas inlet; and at least one gas nozzle extending away from the at least one gas inlet. In some aspects, the CVD unit further comprises an enclosure encasing the at least one plasma source, the at least one gas inlet and the at least one gas nozzle. In some aspects, the apparatus further comprises a recoater mechanism comprising a recoater arm. In some aspects, the recoater arm comprises a recoater blade. In some aspects, the CVD unit is on the recoater arm. In some aspects, the CVD unit is a on a positioning unit. In some aspects, the build material is a polymer, a ceramic slurry, metallic slurry, or a metal powder. In some aspects, the apparatus further comprises a galvo scanner.

These and other aspects of the invention will become more fully understood upon a review of the detailed description, which follows.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

The present application is directed to methods and apparatuses for chemical vapor deposition (CVD) during additive manufacturing (AM) processes. CVD may be used during AM processes to add chemical signatures during manufacturing, thus facilitating the process of telling original products apart from replicas that may be of inferior quality.

According to the present disclosure, CVD is used to deposit a material on a layer of an object being built in a layer-by-layer manner by an AM process. The deposition may occur on a recently solidified layer, or component layer, or upon powder prior to solidification or fusing of that powder material into a component layer. The component layer may be the first layer, the final layer, or an intermediate layer of the object being built. However, by using CVD after building the first layer but before building the final layer of the object during AM, an identifying chemical marker may be able to be placed out of sight of would-be copycats, thereby making it harder for would-be copycats to produce replicas of the object and making it easier to identify replicas or counterfeits. Objects built in such a manner, with internal CVD-deposited chemical markers, may be able to be identified by spectroscopic or imaging methods by the consumer, the manufacturer, or a third party. The CVD-deposited materials of the present disclosure may also form objects built from multiple materials, with CVD-added materials conferring properties such as, but not limited to, greater mechanical resistance, greater corrosion resistance, and greater electrical conductivity.

As used herein, a material is "opaque" to radiation if the material does not transmit incoming radiation.

As used herein, "radiation" refers to energy in the form of waves or particles, including, but not limited to, heat, radio waves, visible light, x-rays, radioactivity, acoustic radiation, and gravitational radiation.

As used herein, a "contrast agent" is a substance used to enhance the contrast of structures or fluids within an object in imaging applications.

FIGS. 2A-3E show schematic diagrams of an apparatus for using CVD during AM according to some embodiments of the present disclosure.

Figure 1:
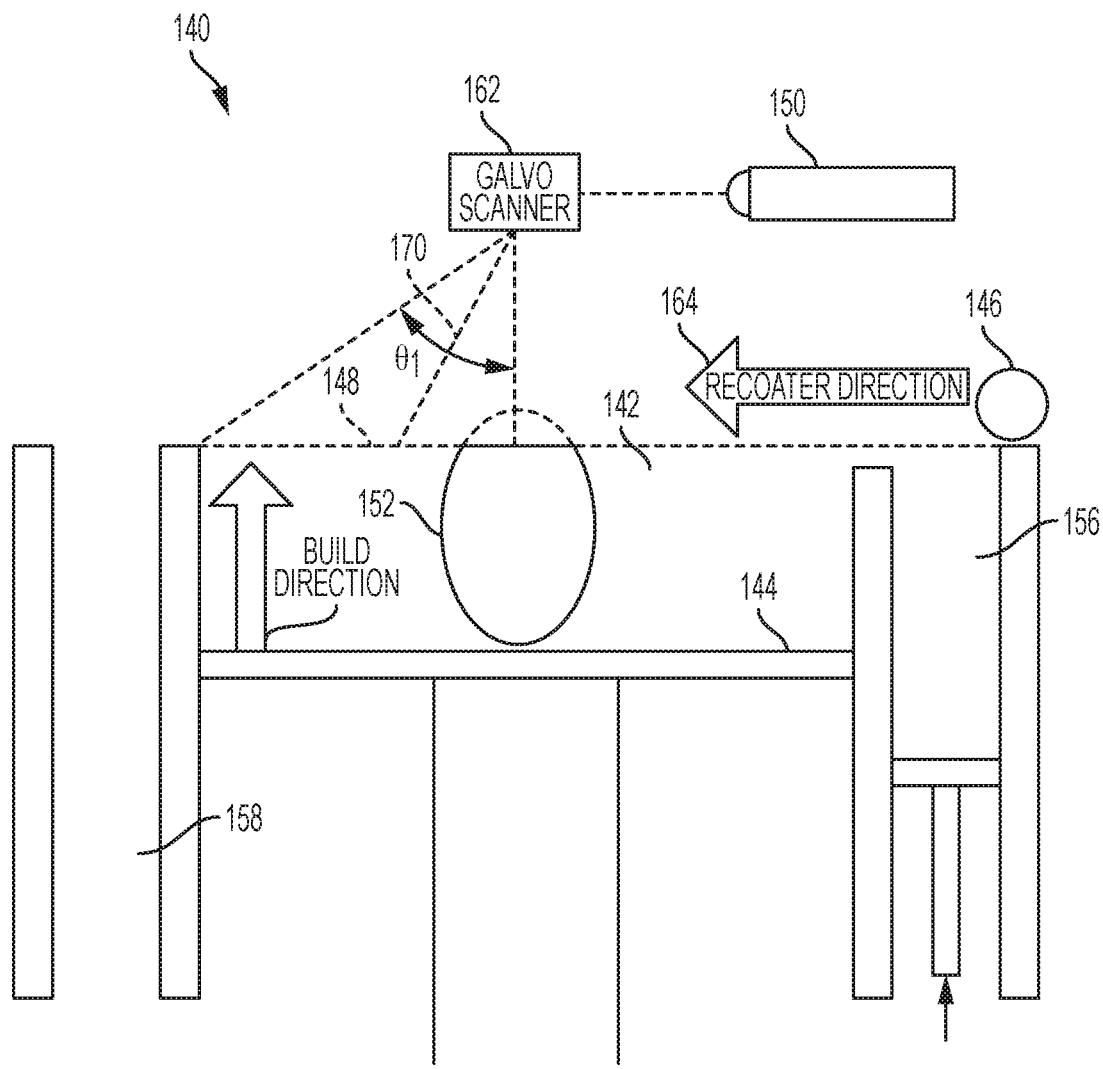
FIG. 1 shows an example of an apparatus for AM according to conventional methods.
Figure 2A:
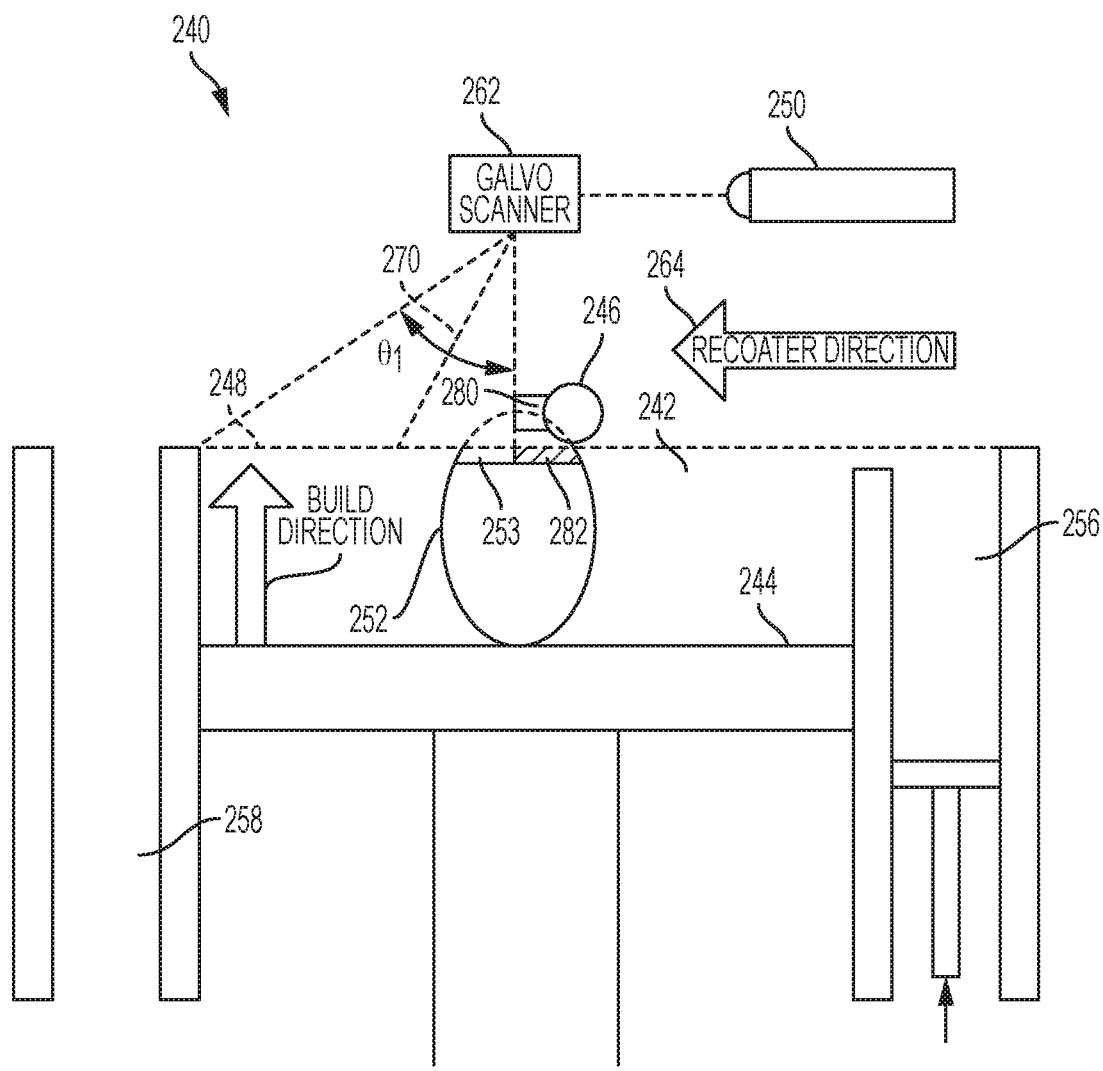
FIG. 2A shows a schematic diagram of CVD during AM according to a first embodiment of the present disclosure.

According to a first embodiment of the present disclosure, apparatus 240 may be equipped with a CVD unit 280 (see FIG. 2A). In a first embodiment, CVD unit 280 may be attached to a mechanism for providing a layer of powder, such as a recoater mechanism, such as recoater arm 246. After the formation of at least one fused or solidified region of a build material 253, during the manufacture of an object 252, CVD unit 280 deposits by CVD a second material 282 over at least a portion of one or more of the fused or solidified regions of the most recently fused or solidified layer of object 252 (see FIG. 2A). Alternatively, CVD unit 280 may deposit by CVD a second material 282 over at least a portion of powder material prior to being fused or solidified by a mechanism for selectively fusing or solidifying at least a portion of the layer of powder. The mechanism may be an energy beam from an energy source, which may be but is not limited to a laser source or an electron beam source. In an alternate embodiment, the mechanism for selectively fusing may be binder jetting.

CVD unit 280 deposits a second material that is a vapor phase chemical substance onto at least a portion of one or more fused regions of a recently fused or solidified layer of a build material or, alternatively, over at least a portion of powder material prior to being fused or solidified by an energy beam. The CVD unit 280 may be used to deposit any vapor phase chemical suitable for use in conjunction with apparatus 240 and the build material.

Chemicals suitable for use with CVD include those with gaseous precursors, as will be known to persons of ordinary skill in the art. Suitable second materials that may be deposited by CVD are known in the art and include, but are not limited to, those disclosed in, for example, U.S. Pat. No. 3,565,676 (tungsten, molybdenum, rhenium, and mixtures thereof); U.S. Pat. No. 3,656,995 (carbides, nitrides, and carbonitrides of boron, silicon, and the transition metals of Groups IVB, VB, and VIB of the periodic table of elements); U.S. Pat. No. 3,594,216 (nickel, copper, cobalt, chromium, iron, manganese, palladium, platinum, and mixtures thereof, or alloys of iron, cobalt, copper, nickel, and chromium); U.S. Pat. No. 5,656,329 (epitaxial silicon, polysilicon, silicon dioxide, silicon nitride, tungsten, titanium nitride, perovskite-phase mixed-metal oxides); U.S. Pat. No. 6,743,473 (metal, metal nitride, metal carbon nitride, and metal silicon nitride films, containing the metals hafnium and the Group VB metals of vanadium, tantalum, and niobium); U.S. Pat. No. 6,475,902 (niobium nitride); and U.S. Pat. No. 6,548,899 (silicon nitride, titanium nitride, tantalum nitride, tantalum oxynitride, tungsten oxynitride, silicon oxynitride and blends thereof, and silicon oxide), each of which is herein incorporated by reference in its entirety.

Suitable CVD methods according to the present disclosure include, but are not limited to, atmospheric pressure CVD (APCVD), low-pressure CVD (LPCVD), ultrahigh vacuum CVD (UHVCVD), aerosol-assisted CVD (AACVD), direct liquid injection CVD (DLICVD), hot wall CVD, cold wall CVD, microwave plasma-assisted CVD (MPCVD), plasma-enhanced CVD (PECVD), remote plasma-enhanced CVD (RPECVD), atomic-layer CVD (ALCVD), combustion chemical vapor deposition (CCVD), hot filament CVD (HFCVD), hybrid physical-chemical vapor deposition (HPCVD), metalorganic chemical vapor deposition (MOCVD), rapid thermal CVD (RTCVD), vapor-phase epitaxy (VPE), and photo-initiated CVD (PICVD). In a preferred embodiment, the present disclosure is directed to methods and apparatuses for PECVD during AM. CVD methods are generally known in the art and are described, for example, in U.S. Pat. Nos. 3,565,676; 3,656,995; 3,594,216; 5,656,329; 6,743,473; 6,475,902; and 6,548,899, each of which is incorporated herein by reference in its entirety.

Although certain embodiments of the present disclosure are directed to CVD apparatuses containing arc electrodes (see FIGS. 2D, 2E, 3D, and 3E), CVD in accordance with certain aspects of the present disclosure may also be conducted without electrodes. Suitable starting materials for CVD of second materials according to the present disclosure are known in the art and may include, but are not limited to, vaporized metal organic beta-ketoamine chelates, such as nickel acetylacetone imide, copper acetylacetone imide, bisacetyl-acetoneethylenediimine nickel (II), bisacetylacetoneethylenediimino copper (II), bisacetylacetone imide nickel (II), cobalt (II) acetylacetone imide, bisacetylacetone imide cobalt (II), bis-4-imino-2-pentanonato cobalt (II), nickel (II) trifluoroacetylacetone imide, bis-2-imino-1,1,1-trifluoro-4-pentanonato nickel (II), nickel acetylacetone-1, 2-propylene diimide, and mixtures thereof, such as to form alloys by CVD). These starting materials are either commercially available or may be synthesized by known methods, e.g., those disclosed in U.S. Pat. No. 3,594,216.

The method and apparatus of the present disclosure involve localized CVD, for site-specific deposition of a second material, which offers advantages over the art. For example, localized CVD avoids contaminating the entire build area or the build material with CVD precursors and/or carrier gases. As a result, any need to purge and/or pump the down the process chamber between layers is eliminated. In addition, the method and apparatus of the present disclosure may facilitate the anti-counterfeiting operations, integrated part coating, and production of graded material composition parts.

In some aspects, the CVD unit 280 may be used to deposit a second material 282 with desirable properties, such as for tagging, identification, or anti-counterfeiting purposes and related detection methods, or to impart desirable material properties to the manufactured object. In some aspects, the second material may be more opaque to x-ray radiation than the build material in the fused state. In some aspects, the second material may be more opaque to radioactivity than the build material in the fused state. In some aspects, the second material may be a radioactive emitter, to enable tagging of the parts. Preferably, the second material 282 for CVD differs from the additive build material 253 in one or more physicochemical properties, a non-exhaustive list of examples of which is provided in the following discussion. In some aspects, the second material may have a different density than the build material in the fused or solidified state. In some aspects, the second material 282 may have a different absorbance energy than the build material in the fused or solidified state as measured by computed tomography (CT) scanning. In some aspects, the second material 282 has different mechanical wear properties than the build material 253 in the fused or solidified state. In some aspects, the second material 282 has greater corrosion resistance than the build material 253 in the fused or solidified state. Additionally, compared to the additive build material 253 in the fused or solidified state, the second material 282 for CVD may differ of at least one of infra-red (IR) emissivity, IR absorptivity or reflectivity, ultra-violet (UV) absorptivity or reflectivity, secondary x-ray emission energy profile, neutron scattering profile, surface energy, coefficient of friction, thermal conductivity, electrical conductivity, acoustic propagation properties, fatigue resistance, wear resistance, tribology, surface properties. In some aspects, the second material has different electrical conductivity than the build material.

In some aspects, the second material is a contrast agent. The selection of a suitable contrast agent will depend on the particular application and on the build material. Suitable contrast agents include those that are non-reactive with any metals contained within build materials (e.g., aluminum, cobalt, nickel) and those that are not themselves contained within the build material of use. Materials known to be contrast agents in certain circumstances include, but are not limited to, high-atomic numbered metals (e.g., tungsten or osmium). For example, tungsten or osmium may be suitable x-ray CT contrast agents for aluminum or cobalt- or nickel-based superalloys. As another example, if the build material is cobalt chrome, a suitable contrast agent may be any other metal or non-metal.

In some aspects, the second material is deposited in a single layer. In some aspects, the second material is deposited by CVD over multiple layers, to obtain a 3D contrast image. After the second material 282 has been deposited, build plate 244 is lowered, and recoater arm 246 evenly spreads a subsequent layer of build material over powder bed 242 and the most recently fused or solidified layer of object 252 (see FIG. 2B). In some aspects, the subsequent layer of build material is spread over the deposited second material 282, and the deposited second material 282 is fused or solidified or allowed to solidify before the subsequent layer of build material is spread over it. In some aspects, no subsequent layer of build material is spread over the deposited second material 282. In some aspects, second material 282 is deposited over at least a portion of powder material prior to being fused or solidified, the deposited second material 282 is fused or solidified or allowed to solidify, and the powder material is fused or solidified. In some aspects, a subsequent layer of build material may be spread over the fused or solidified layer and the fused or solidified deposited second material 282.

Figure 2B:
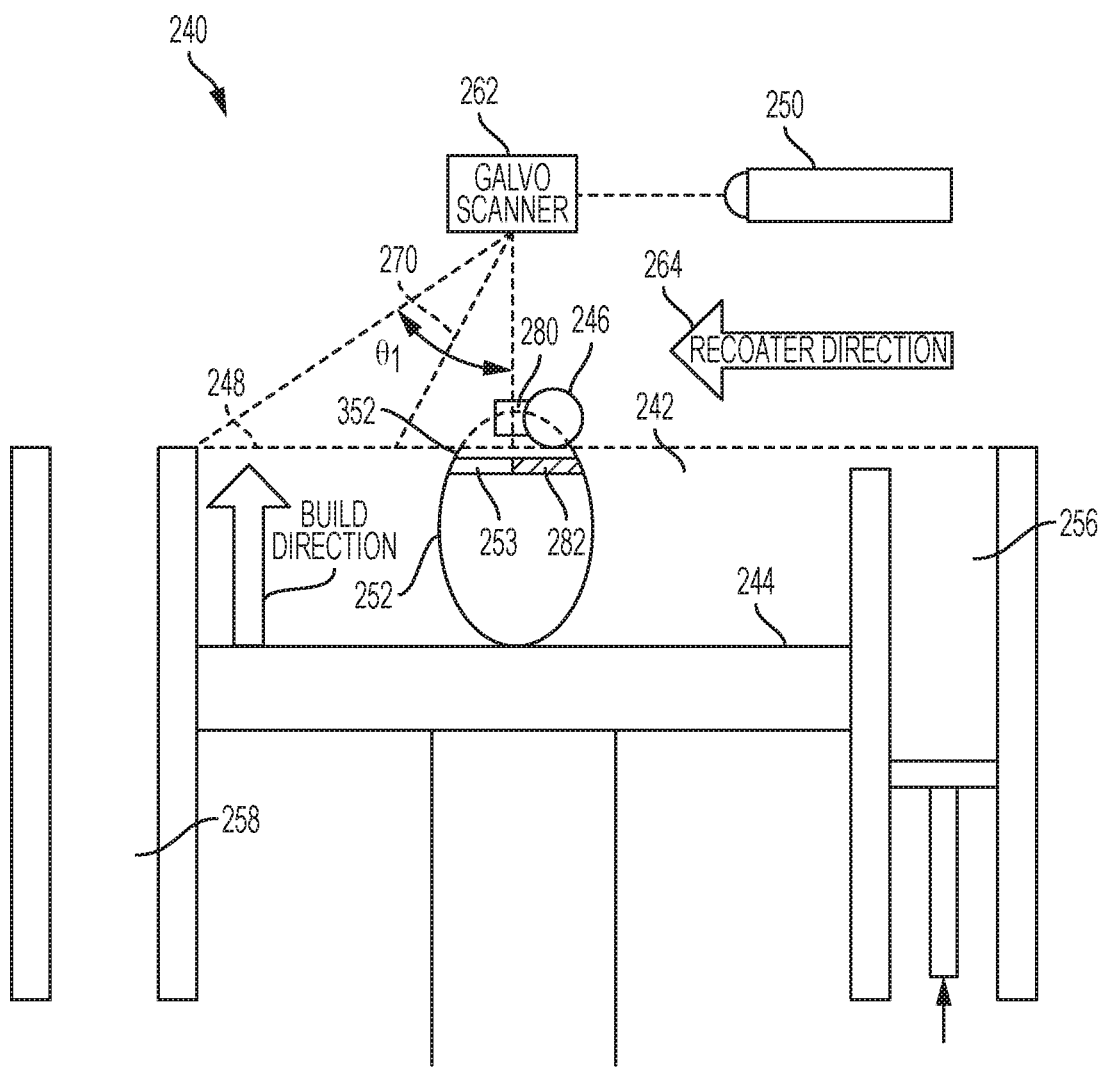
FIG. 2B shows a schematic diagram of spreading a subsequent layer of build material after CVD according to a first embodiment of the present disclosure.
Figure 2C:
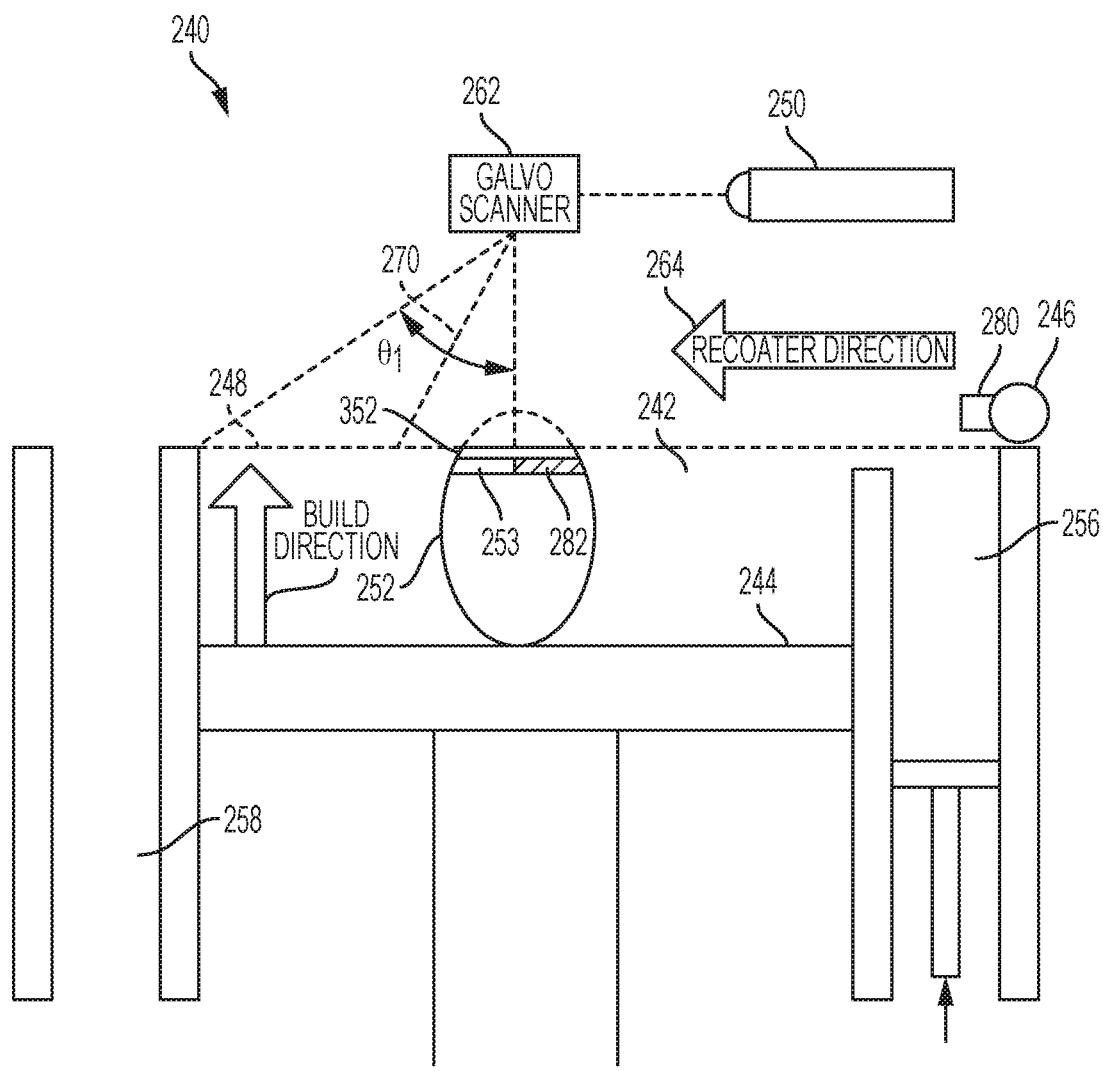
FIG. 2C shows a schematic diagram of irradiating at least a portion of a given layer of a build material according to a first embodiment of the present disclosure.

The energy beam 270 sinters or melts a cross-sectional layer of the object 252 being built under control of an irradiation emission directing device, such as a galvo scanner 262 (see FIG. 2C). The galvo scanner 262 may comprise, for example, a plurality of movable mirrors or scanning lenses. The speed at which the laser is scanned is a critical controllable process parameter, impacting how long the laser power is applied to a particular spot. Typical laser scan speeds are on the order of 10 to 1000 millimeters per second. The build platform 244 is lowered and another layer of powder is spread over the powder bed and object being built, followed by successive melting/sintering of the powder by the laser 250. The powder layer is typically, for example, 10 to 100 microns in thickness. The process is repeated until the object 252 is completely built up from the melted/sintered powder material. The laser 250 may be controlled by a computer system (not shown) including a processor and a memory. The computer system may determine a scan pattern for each layer and control laser 250 to irradiate the powder material according to the scan pattern. After fabrication of the object 252 is complete, various post-processing procedures may be applied to the object 252. Post processing procedures include removal of excess powder by, for example, blowing or vacuuming. Other post processing procedures include a stress release process. Additionally, thermal and chemical post processing procedures can be used to finish the object 252.

The energy source may emit radiation at any wavelength suitable for use in additive printing methods, as will be known to those of skill in the art. In some aspects, the energy source may be a laser for producing a laser beam. In some aspects, the energy source may be an electron beam source, such as a filament that emits electrons when a current flows through it.

As shown in FIGS. 2A-2C, the CVD unit 280, may be advantageously attached to the recoater mechanism (e.g. recoater arm 146) to allow two- or three-dimensional movement of the CVD unit 280 around the build environment.

Figure 2D:
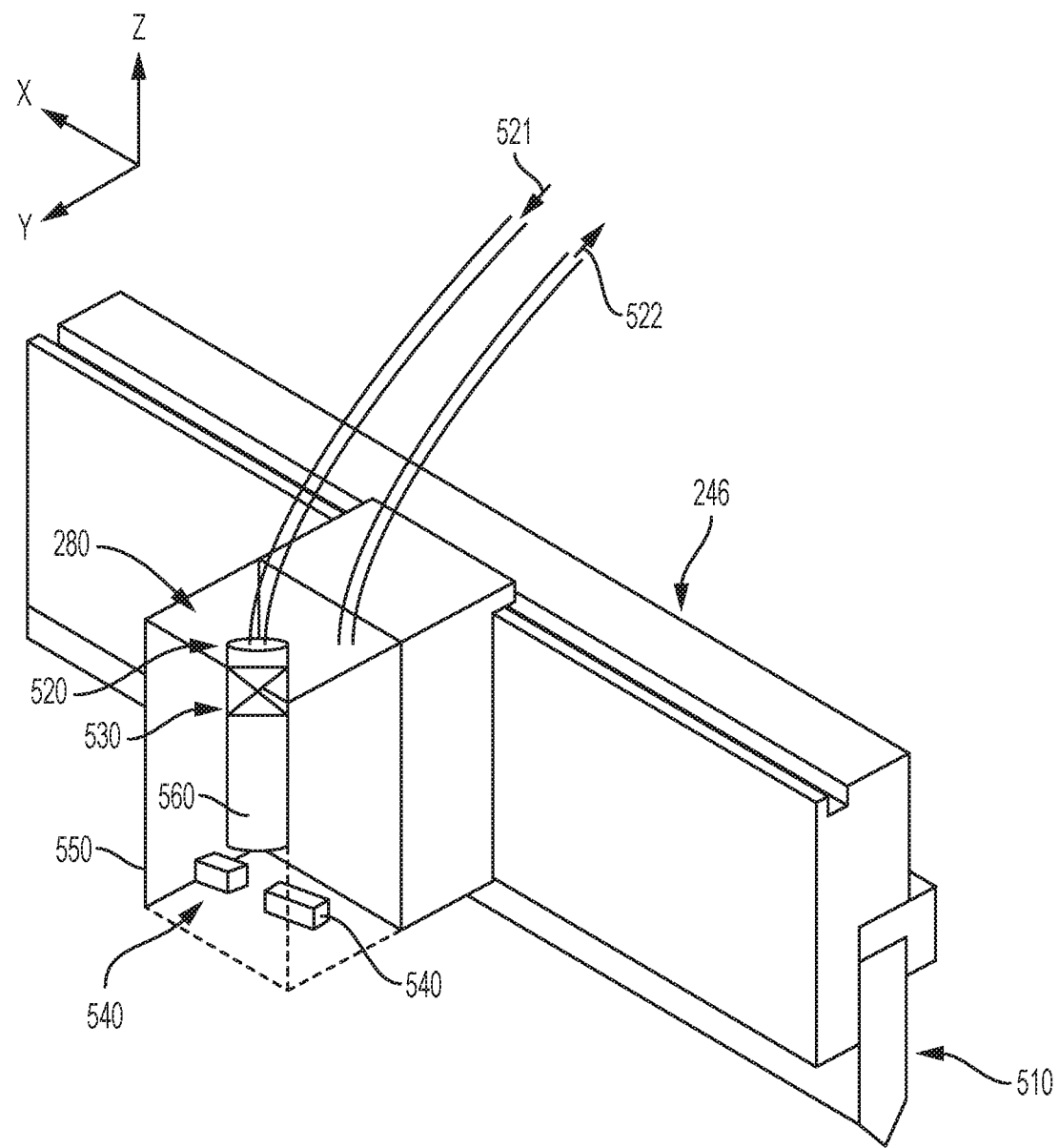
FIG. 2D shows an example of a CVD unit for use according to a first embodiment of the present disclosure.

FIG. 2D shows an example of a CVD unit 280 attached to a recoater arm 246. The normal motion of the recoater arm 246 enables positioning in one dimension (direction 264 in FIGS. 2A-2C or the direction indicated by the arrow "Y" in FIG. 2D). Utilizing the recoater arm as a rail in conjunction with a mechanism to enable motion along the rail allows motion in a second dimension (the direction indicated by the arrow "X" in FIG. 2D). In one embodiment, this mechanism to enable motion is a linear gear and motor. In a further embodiment, this mechanism is a motor mounted to the recoater arm 246 in conjunction with a drive belt attached to the CVD unit 280. In a further embodiment, the mechanism of motion is a slot-electric motor or a mag-lev drive. The motion of the build surface allows motion in a third dimension (the direction indicated by the arrow "Z" in FIG. 2D).

A key aspect of the invention is the need for the CVD process gas to be somehow contained and/or released close to the build surface. This is because, if the CVD process gas is not confined or released sufficiently close to the build surface, it would be difficult or even impossible to control where the second material 282 is deposited. It is necessary that the CVD process gas is released no more than 2 cm away from the build surface in order to be sufficiently close, preferably 0.1-2 cm. Accordingly, in certain embodiments, the recoater arm 246 (FIG. 2D) may be operable to move and position the CVD unit 280 in direction 264 (FIGS. 2A-2C) or the direction indicated by the arrow "Y" in FIG. 2D. Additionally, movement of CVD unit 280 along the length of the recoater arm 246 itself (FIG. 2D) (e.g. as indicated by the arrow "X" in FIG. 2D) allows movement and positioning in a second direction. Importantly, the proximity of the CVD unit 280 on recoater arm 246 or positioning unit 283 to the powder bed 242 ensures that the CVD unit 280 is sufficiently close to the powder bed 242 and the build surface. Movement along the length of the recoater arm 246 or positioning unit 283 may be facilitated using a drive motor and a linear gear mechanism, a drive motor and drive belt, slot-electric motor drive, or a mag-lev (magnetic levitation) drive.

FIG. 2D shows a close-up view of CVD unit 280 according to some aspects of the present disclosure. In some aspects, the recoater arm 246 may comprise a recoater blade 510. In some aspects, CVD unit 280 comprises a CVD process gas inlet 520, a valve/actuator 530, gas nozzle 560, one or more gas inlet tubes 521, gas outlet tube 522, and arc electrodes 540. In some aspects, the one or more inlet tubes 521 connects gas nozzle 560 to a reaction chamber where, for example, a CVD starting material is heated to vaporization, generating a CVD process gas. In some aspects, a carrier gas may be used to carry the CVD process gas through the one or more gas inlet tubes 521 to gas nozzle 560. Suitable carrier gases include, but are not limited to, hydrogen, helium, nitrogen, and argon.

The CVD process gas travels through the one or more gas inlet tubes 521, gas inlet 520, valve/actuator 530, and gas nozzle 560 through the arc electrodes 540, out the CVD unit 280, and onto at least a portion of one or more fused or solidified regions of the most recently solidified or fused layer of build material in the manufacture of object 252, or onto at least a portion of one or more unfused or unsolidified powder regions in a powder layer of build material in the manufacture of object 252. In some aspects, arc electrodes 540 can be used to generate an electromagnetic field to facilitate decomposition of the CVD feed gas, effectively creating a plasma enhanced or PECVD process. Additionally or alternatively, a plasma-enhanced CVD process may be generated or strengthened (e.g. by increasing plasma density) using a miniaturized helical resonator or an electron cyclotron resonance (ECR) plasma reactor. Examples of CVD systems or process incorporating the helical resonator and the ECR plasma source are described in U.S. Pat. Nos. 5,241,245; 5,304,282 and 5,183,685, which are each incorporated herein by reference.

FIG. 2D shows the enclosure 550 which serves not only as a frame to hold the CVD process gas inlet 520, valve/actuator 530, gas nozzle 560 and arc electrodes 540, but to also confine the CVD process gas. The gas nozzle 560 extending below the actuator 530 and downward (i.e. away from the gas inlet 520 and toward the build surface) ensures that the CVD process gas is released adjacent to the build surface.

Figure 2E:
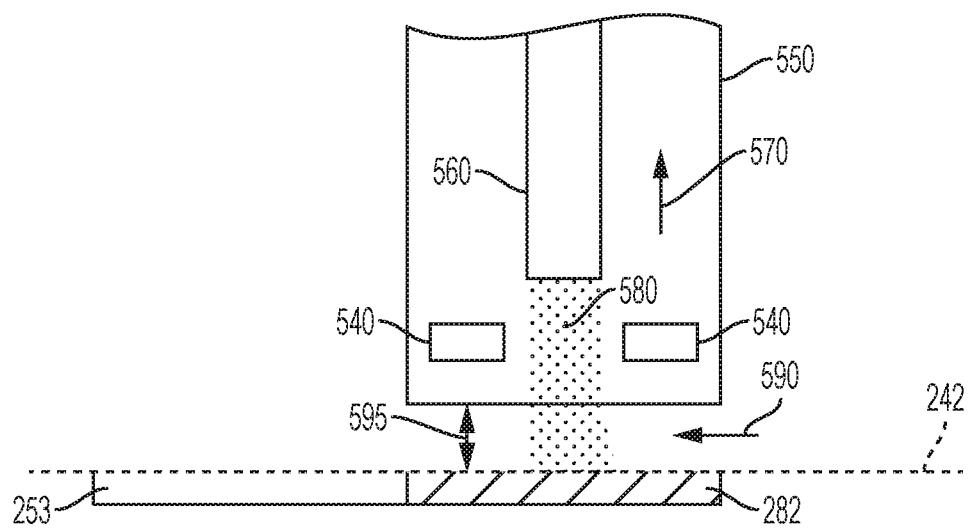
FIG. 2E shows a close-up view of chemical vapor deposition of a second material at the build surface, according to a first embodiment of the present disclosure.

FIG. 2E shows the clearance 595 between enclosure 550 and the build surface according to one embodiment of the present disclosure. CVD process gas 580 exiting gas nozzle 560 decomposes and deposits on the build surface to form second material 282; in some aspects, decomposition may be facilitated by an electromagnetic field generated by arc electrodes 540. The small clearance 595 existing between the bottom of the enclosure 550 and the build surface allows clearance for motion of CVD unit 280 as well as for the inert gas flowing 590 through the build environment to sweep away unreacted CVD process gas 580. In some aspects, clearance 595 is minimized to minimize leakage of unreacted CVD process gas out of enclosure 550 into the build chamber of apparatus 240. For this reason, it may be advantageous that the recoater arm 246 is operable to further move and position the CVD unit 280 in a third direction (e.g. as indicated by the arrow "Z" in FIG. 2D). In addition, unreacted CVD process gas may escape via path 570 and out the gas outlet tube 522. In some aspects, removal of unreacted CVD process gas via the gas outlet tube 522 may be facilitated by a vacuum pump and/or a cold trap to condense vapors.

In another embodiment, the apparatus 240 can be operated with no clearance between enclosure 550 and the build surface, such as to provide a vacuum environment for a vacuum CVD method or to minimize leakage of unreacted CVD process gas out of enclosure 550 into the build chamber of additive manufacturing apparatus 240.

Figure 3A:
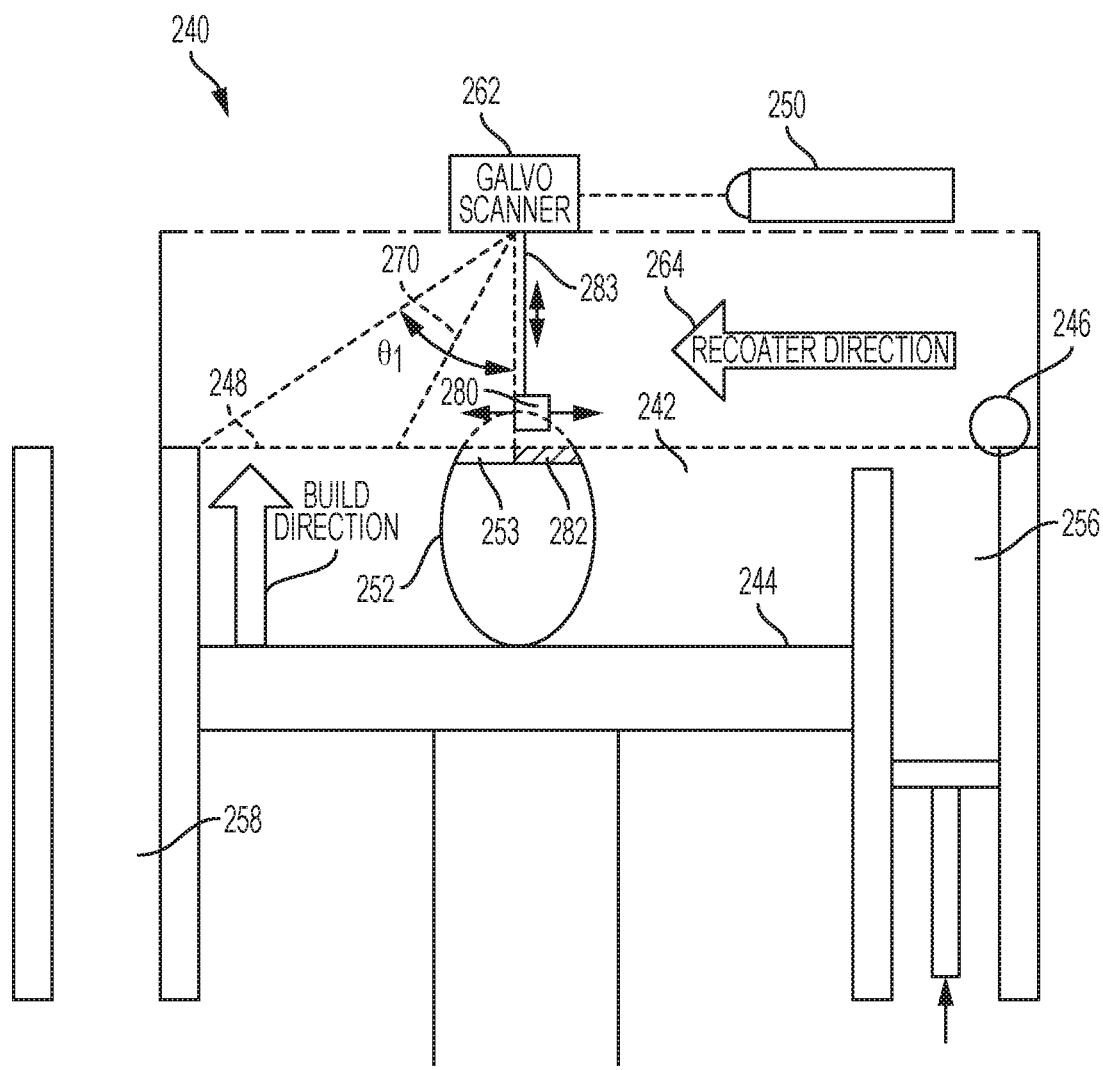
FIG. 3A shows a schematic diagram of CVD during AM according to a second embodiment of the present disclosure.

According to a second embodiment of the present disclosure, apparatus 240 may be equipped with a CVD unit 280 (see FIG. 3A). In a second embodiment, CVD unit 280 may be attached to a positioning unit, such as positioning unit 283. After the formation of at least one fused or solidified region of a build material 253, during the manufacture of an object 252, CVD unit 280 deposits by CVD a second material 282 over at least a portion of one or more of the fused or solidified regions of the most recently fused or solidified layer of object 252 (see FIG. 3A). Alternatively, CVD unit 280 may deposit by CVD a second material 282 over at least a portion of powder material prior to being fused or solidified by mechanism for selectively fusing or solidifying at least a portion of the layer of powder. The mechanism may be an energy beam from an energy source, which may be but is not limited to a laser source or an electron beam source. In an alternate embodiment, the mechanism for selectively fusing may be binder jetting. The apparatus 240 shown in FIG. 3A may have identical features to that shown in FIG. 2A.

Figure 3B:
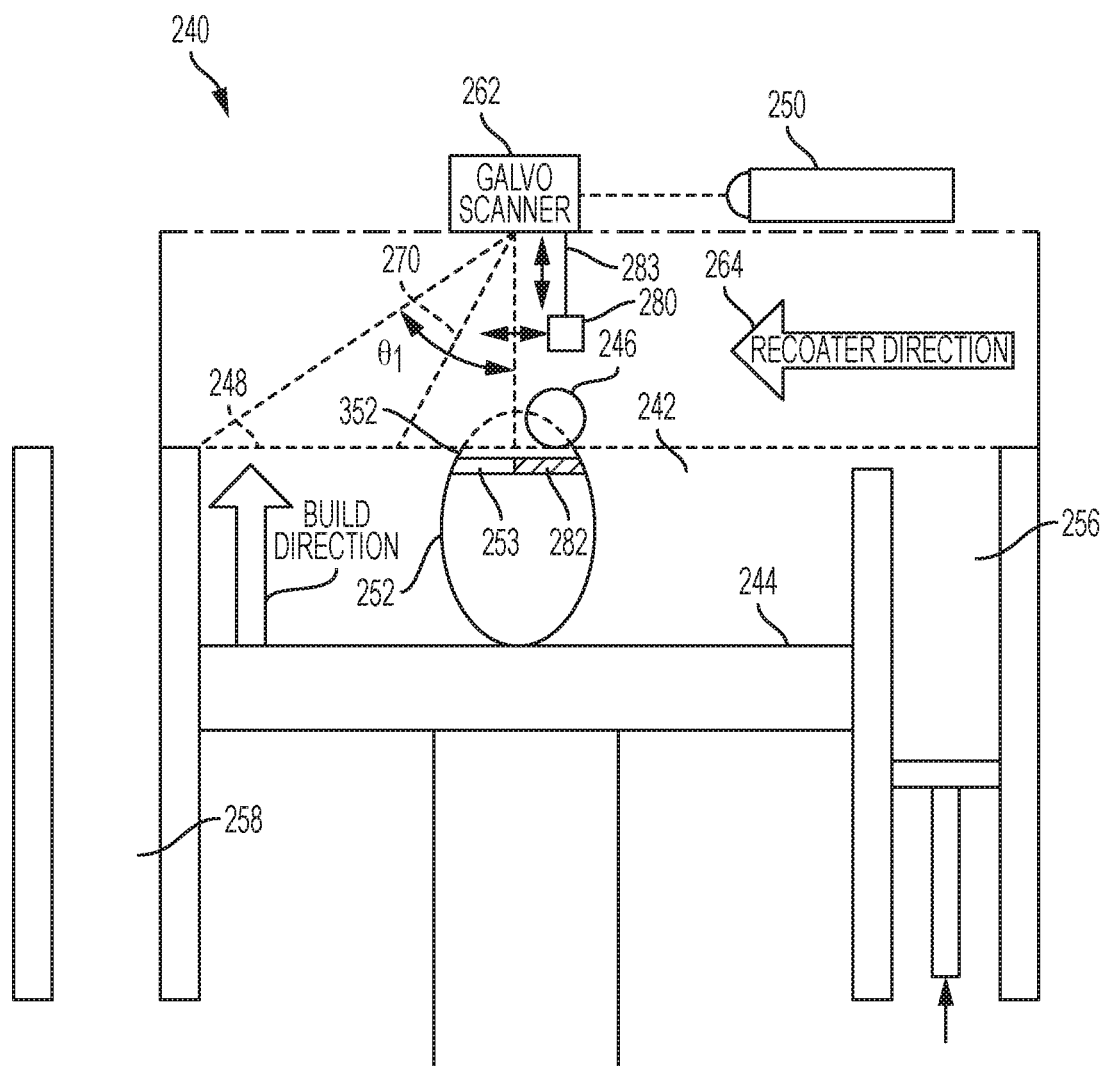
FIG. 3B shows a schematic diagram of spreading a subsequent layer of build material after CVD according to a second embodiment of the present disclosure.
Figure 3C:
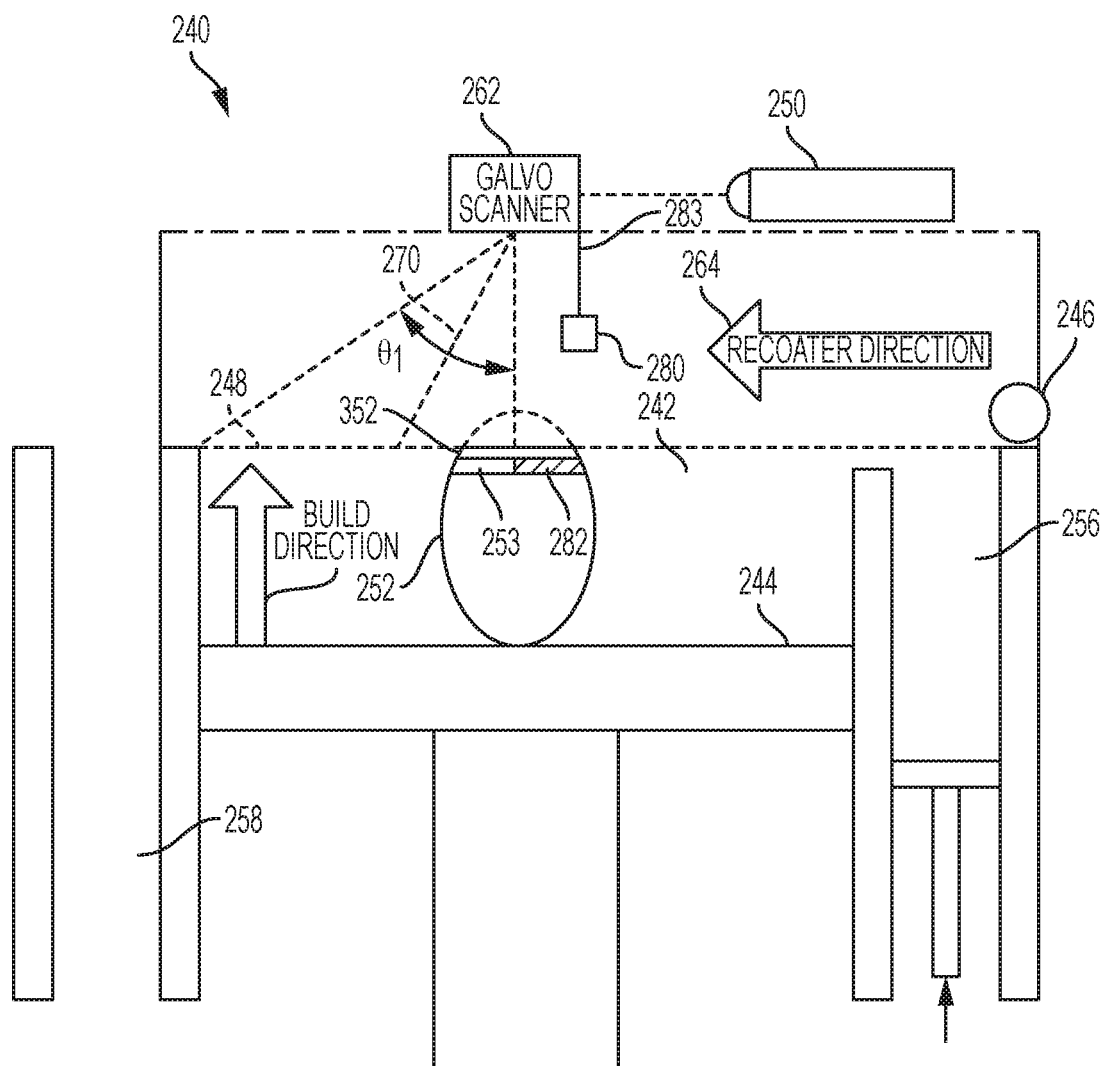
FIG. 3C shows a schematic diagram of irradiating at least a portion of a given layer of a build material according to a second embodiment of the present disclosure.
Figure 3D:
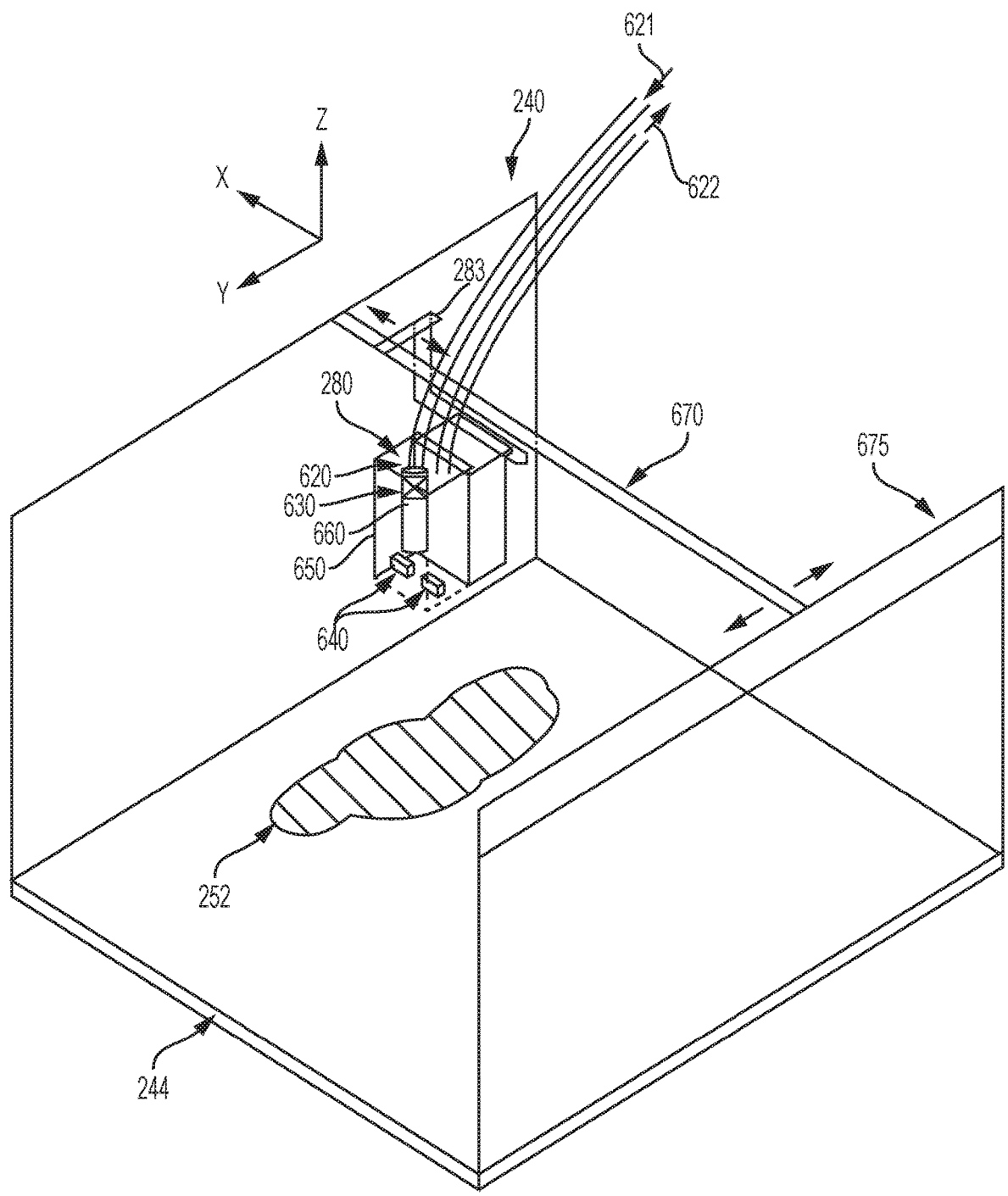
FIG. 3D shows an example of a CVD unit attached to a positioning unit according to a second embodiment of the present disclosure.

According to a second embodiment, CVD unit 280 may be attached to a positioning unit 283, such as a motorized robotic arm, e.g., robotic arm 283 of FIG. 3D, separate from the recoater mechanism, and positioning unit 283 is preferably computer-controlled. In an alternative embodiment, the positioning unit 283 may be a gantry, e.g., a X-Y-Z gantry, whereby a plurality of rails or crossbeams, drive belts, drive screws, and/or a Cartesian gantry may be utilized to position the CVD unit close to the powder bed 242. In yet further alternative embodiments, the positioning unit 283 may be a delta robot, a cable robot, a belt drive, or the like.

CVD unit 280 deposits a second material that is a vapor phase chemical substance onto at least a portion of one or more fused or solidified regions of a recently fused or solidified layer of a build material or, alternatively, over at least a portion of powder material prior to being fused or solidified by an energy beam. The CVD unit 280 may be used to deposit any vapor phase chemical suitable for use in conjunction with apparatus 240 and the build material.

Chemicals suitable for use with CVD include those with gaseous precursors, as will be known to persons of ordinary skill in the art. Suitable second materials that may be deposited by CVD are known in the art and include, but are not limited to, those disclosed in, for example, U.S. Pat. No. 3,565,676 (tungsten, molybdenum, rhenium, and mixtures thereof); U.S. Pat. No. 3,656,995 (carbides, nitrides, and carbonitrides of boron, silicon, and the transition metals of Groups IVB, VB, and VIB of the periodic table of elements); U.S. Pat. No. 3,594,216 (nickel, copper, cobalt, chromium, iron, manganese, palladium, platinum, and mixtures thereof, or alloys of iron, cobalt, copper, nickel, and chromium); U.S. Pat. No. 5,656,329 (epitaxial silicon, polysilicon, silicon dioxide, silicon nitride, tungsten, titanium nitride, perovskite-phase mixed-metal oxides); U.S. Pat. No. 6,743,473 (metal, metal nitride, metal carbon nitride, and metal silicon nitride films, containing the metals hafnium and the Group VB metals of vanadium, tantalum, and niobium); U.S. Pat. No. 6,475,902 (niobium nitride); and U.S. Pat. No. 6,548,899 (silicon nitride, titanium nitride, tantalum nitride, tantalum oxynitride, tungsten oxynitride, silicon oxynitride and blends thereof, and silicon oxide), each of which is herein incorporated by reference in its entirety.

Suitable CVD methods according to the present disclosure include, but are not limited to, atmospheric pressure CVD (APCVD), low-pressure CVD (LPCVD), ultrahigh vacuum CVD (UHVCVD), aerosol-assisted CVD (AACVD), direct liquid injection CVD (DLICVD), hot wall CVD, cold wall CVD, microwave plasma-assisted CVD (MPCVD), plasma-enhanced CVD (PECVD), remote plasma-enhanced CVD (RPECVD), atomic-layer CVD (ALCVD), combustion chemical vapor deposition (CCVD), hot filament CVD (HFCVD), hybrid physical-chemical vapor deposition (HPCVD), metalorganic chemical vapor deposition (MOCVD), rapid thermal CVD (RTCVD), vapor-phase epitaxy (VPE), and photo-initiated CVD (PICVD). In a preferred embodiment, the present disclosure is directed to methods and apparatuses for PECVD during AM. CVD methods are generally known in the art and are described, for example, in U.S. Pat. Nos. 3,565,676; 3,656,995; 3,594,216; 5,656,329; 6,743,473; 6,475,902; and 6,548,899, each of which is incorporated herein by reference in its entirety.

Although certain embodiments of the present disclosure are directed to CVD apparatuses containing arc electrodes (see FIGS. 2D, 2E, 3D, and 3E), CVD in accordance with certain aspects of the present disclosure may also be conducted without electrodes. Suitable starting materials for CVD of second materials according to the present disclosure are known in the art and may include, but are not limited to, vaporized metal organic beta-ketoamine chelates, such as nickel acetylacetone imide, copper acetylacetone imide, bisacetyl-acetoneethylenediimine nickel (II), bisacetylacetoneethylenediimino copper (II), bisacetylacetone imide nickel (II), cobalt (II) acetylacetone imide, bisacetylacetone imide cobalt (II), bis-4-imino-2-pentanonato cobalt (II), nickel (II) trifluoroacetylacetone imide, bis-2-imino-1,1,1-trifluoro-4-pentanonato nickel (II), nickel acetylacetone-1, 2-propylene diimide, and mixtures thereof, such as to form alloys by CVD). These starting materials are either commercially available or may be synthesized by known methods, e.g., those disclosed in U.S. Pat. No. 3,594,216.

The method and apparatus of the present disclosure involve localized CVD, for site-specific deposition of a second material, which offers advantages over the art. For example, localized CVD avoids contaminating the entire build area or the build material with CVD precursors and/or carrier gases. As a result, any need to purge and/or pump the down the process chamber between layers is eliminated. In addition, the method and apparatus of the present disclosure may facilitate the anti-counterfeiting operations, integrated part coating, and production of graded material composition parts.

In some aspects, the CVD unit 280 may be used to deposit a second material 282 with desirable properties, such as for tagging, identification, or anti-counterfeiting purposes and related detection methods, or to impart desirable material properties to the manufactured object. In some aspects, the second material may be more opaque to x-ray radiation than the build material in the fused state. In some aspects, the second material may be more opaque to radioactivity than the build material in the fused state. In some aspects, the second material may be a radioactive emitter, to enable tagging of the parts. Preferably, the second material 282 for CVD differs from the additive build material 253 in one or more physicochemical properties, a non-exhaustive list of examples of which is provided in the following discussion. In some aspects, the second material may have a different density than the build material in the fused or solidified state. In some aspects, the second material 282 may have a different absorbance energy than the build material in the fused or solidified state as measured by computed tomography (CT) scanning. In some aspects, the second material 282 has different mechanical wear properties than the build material 253 in the fused or solidified state. In some aspects, the second material 282 has greater corrosion resistance than the build material 253 in the fused or solidified state. Additionally, compared to the additive build material 253 in the fused or solidified state, the second material 282 for CVD may differ of at least one of infra-red (IR) emissivity, IR absorptivity or reflectivity, ultra-violet (UV) absorptivity or reflectivity, secondary x-ray emission energy profile, neutron scattering profile, surface energy, coefficient of friction, thermal conductivity, electrical conductivity, acoustic propagation properties, fatigue resistance, wear resistance, tribology, surface properties. In some aspects, the second material has different electrical conductivity than the build material.

In some aspects, the second material is a contrast agent. The selection of a suitable contrast agent will depend on the particular application and on the build material. Suitable contrast agents include those that are non-reactive with any metals contained within build materials (e.g., aluminum, cobalt, nickel) and those that are not themselves contained within the build material of use. Materials known to be contrast agents in certain circumstances include, but are not limited to, high-atomic numbered metals (e.g., tungsten or osmium). For example, tungsten or osmium may be suitable x-ray CT contrast agents for aluminum or cobalt- or nickel-based superalloys. As another example, if the build material is cobalt chrome, a suitable contrast agent may be any other metal or non-metal.

In some aspects, the second material is deposited in a single layer. In some aspects, the second material is deposited by CVD over multiple layers, to obtain a 3D contrast image.

CVD unit 280 may be attached to a positioning unit 283 (see FIG. 3A) in some embodiments. The positioning unit 283 according to some aspects of the present disclosure is shown in FIG. 3D. The powder bed apparatus 240 shown in FIG. 3D may have identical features to that shown in FIG. 2A. All aspects described with respect to the CVD unit 280 attached to recoater arm 246 (FIGS. 2A-2D) apply to the CVD unit 280 attached to positioning unit 283 (FIGS. 3A-3D) with equal force.

After the second material 282 has been deposited, build plate 244 is lowered, and recoater arm 246 evenly spreads a subsequent layer of build material over powder bed 242 and the most recently fused or solidified layer of object 252 (see FIG. 3B). In some aspects, the subsequent layer of build material is spread over the deposited second material 282, and the deposited second material 282 is fused or solidified or allowed to solidify before the subsequent layer of build material is spread over it. In some aspects, no subsequent layer of build material is spread over the deposited second material 282. In some aspects, second material 282 is deposited over at least a portion of powder material prior to being fused or solidified, the deposited second material 282 is fused or solidified or allowed to solidify, and the powder material is fused or solidified. In some aspects, a subsequent layer of build material may be spread over the fused or solidified layer and the fused or solidified deposited second material 282.

The energy beam 270 sinters or melts a cross-sectional layer of the object 252 being built under control of an irradiation emission directing device, such as a galvo scanner 262 (see FIG. 3C). The galvo scanner 262 may comprise, for example, a plurality of movable mirrors or scanning lenses. The speed at which the laser is scanned is a critical controllable process parameter, impacting how long the laser power is applied to a particular spot. Typical laser scan speeds are on the order of 10 to 1000 millimeters per second. The build platform 244 is lowered and another layer of powder is spread over the powder bed and object being built, followed by successive melting/sintering of the powder by the laser 250. The powder layer is typically, for example, 10 to 100 microns in thickness. The process is repeated until the object 252 is completely built up from the melted/sintered powder material. The laser 250 may be controlled by a computer system (not shown) including a processor and a memory. The computer system may determine a scan pattern for each layer and control laser 250 to irradiate the powder material according to the scan pattern. After fabrication of the object 252 is complete, various post-processing procedures may be applied to the object 252. Post processing procedures include removal of excess powder by, for example, blowing or vacuuming. Other post processing procedures include a stress release process. Additionally, thermal and chemical post processing procedures can be used to finish the object 252.

The energy source may emit radiation at any wavelength suitable for use in additive printing methods, as will be known to those of skill in the art. In some aspects, the energy source may be a laser for producing a laser beam. In some aspects, the energy source may be an electron beam source, such as a filament that emits electrons when a current flows through it.

As shown in FIGS. 3A-3C, the CVD unit 280, may be advantageously attached to a positioning unit 283 to allow two- or three-dimensional movement of the CVD unit 280 around the build environment.

The CVD unit 280 may be attached to a positioning unit 283, such as a motorized robotic arm, e.g. robotic arm 283 of FIG. 3D, separate from the recoater arm 246, and positioning unit 283 is preferably computer-controlled. In an alternative embodiment, the positioning unit 283 may be a gantry, e.g. a X-Y-Z gantry, whereby a plurality of rails or crossbeams, drive belts, drive screws and/or a Cartesian gantry may be utilized to position the CVD unit close to the powder bed 242. In yet further alternative embodiments, the positioning unit 283 may be a delta robot, a cable robot, a belt drive, or the like. Motion of the CVD unit 280 with positioning unit 283 along rail 670 allows movement and positioning of 283 in one direction (e.g., as indicated by the "X" arrow in FIG. 3D). In one embodiment, the mechanism to enable this motion is a linear gear and motor. In a further embodiment, this mechanism is a motor mounted to the positioning unit 283 and/or rail 670 in conjunction with a drive belt attached to the CVD unit 280 and/or positioning unit 283. In a further embodiment, the mechanism of motion is a slot-electric motor or a mag-lev drive. The motion of the build surface allows motion in a third dimension (the direction indicated by the arrow "Z" in FIG. 3D). Motion of rail 670 along sidewalls 675 allows movement and positioning of CVD unit 280 in a second direction (e.g., as indicated by the "Y" arrow in FIG. 3D). Similar mechanism(s) may exist to enable movement of rail 670 along sidewalls 675. Furthermore, the enclosure 650 is positioned to provide a small clearance between the bottom edge of the enclosure and the build surface, such as to allow clearance for motion as well as for the inert gas flowing through the build environment to sweep away unreacted CVD process gas. Accordingly, it may be advantageous that the positioning unit 283 is operable to move and position the CVD unit 280 in a third direction (e.g., as indicated by the "Z" arrow in FIG. 3D).

A key aspect of the invention is the need for the CVD process gas to be somehow contained and/or released close to the build surface. This is because, if the CVD process gas is not confined or released sufficiently close to the build surface, it would be difficult or even impossible to control where the second material 282 is deposited. It is necessary that the CVD process gas is released no more than 2 cm away from the build surface in order to be sufficiently close, preferably 0.1-2 cm. Accordingly, in certain embodiments, the positioning unit 283 (FIG. 3D) may be operable to move and position the CVD unit 280 in the direction indicated by the arrow "Y" in FIG. 3D. Additionally, movement of CVD unit 280 along rail 670 (FIG. 3D) (e.g. as indicated by the arrow "X" in FIG. 3D) allows movement and positioning in a second direction. Importantly, the proximity of the CVD unit 280 on positioning unit 283 to the powder bed 242 ensures that the CVD unit 280 is sufficiently close to the powder bed 242 and the build surface. Movement along the length of the positioning unit 283 (or rail 670) may be facilitated using a drive motor and a linear gear mechanism, a drive motor and drive belt, slot-electric motor drive, or a mag-lev (magnetic levitation) drive.

FIG. 3D shows a close-up view of CVD unit 280 according to some aspects of the present disclosure. In some aspects, CVD unit 280 comprises a CVD process gas inlet 520, a valve/actuator 530, gas nozzle 560, one or more gas inlet tubes 521, gas outlet tube 522, and arc electrodes 540. In some aspects, the one or more inlet tubes 521 connects gas nozzle 560 to a reaction chamber where, for example, a CVD starting material is heated to vaporization, generating a CVD process gas. In some aspects, a carrier gas may be used to carry the CVD process gas through the one or more gas inlet tubes 521 to gas nozzle 560. Suitable carrier gases include, but are not limited to, hydrogen, helium, nitrogen, and argon.

The CVD process gas travels through the one or more gas inlet tubes 521, gas inlet 520, valve/actuator 530, and gas nozzle 560 through the arc electrodes 540, out the CVD unit 280, and onto at least a portion of one or more fused or solidified regions of the most recently solidified or fused layer of build material in the manufacture of object 252, or onto at least a portion of one or more unfused or unsolidified powder regions in a powder layer of build material in the manufacture of object 252. In some aspects, arc electrodes 540 can be used to generate an electromagnetic field to facilitate decomposition of the CVD feed gas, effectively creating a plasma enhanced or PECVD process. Additionally or alternatively, a plasma-enhanced CVD process may be generated or strengthened (e.g. by increasing plasma density) using a miniaturized helical resonator or an electron cyclotron resonance (ECR) plasma reactor. Examples of CVD systems or process incorporating the helical resonator and the ECR plasma source are described in U.S. Pat. Nos. 5,241,245; 5,304,282 and 5,183,685, which are each incorporated herein by reference.

FIG. 3D shows the enclosure 650 which serves not only as a frame to hold the CVD process gas inlet 620, valve/actuator 630, gas nozzle 660, and arc electrodes 640, but to also confine the CVD process gas. The gas nozzle 660 extending below the actuator 630 and downward (i.e. away from the gas inlet 620 and toward the build surface) ensures that the CVD process gas is released adjacent to the build surface.

Figure 3E:
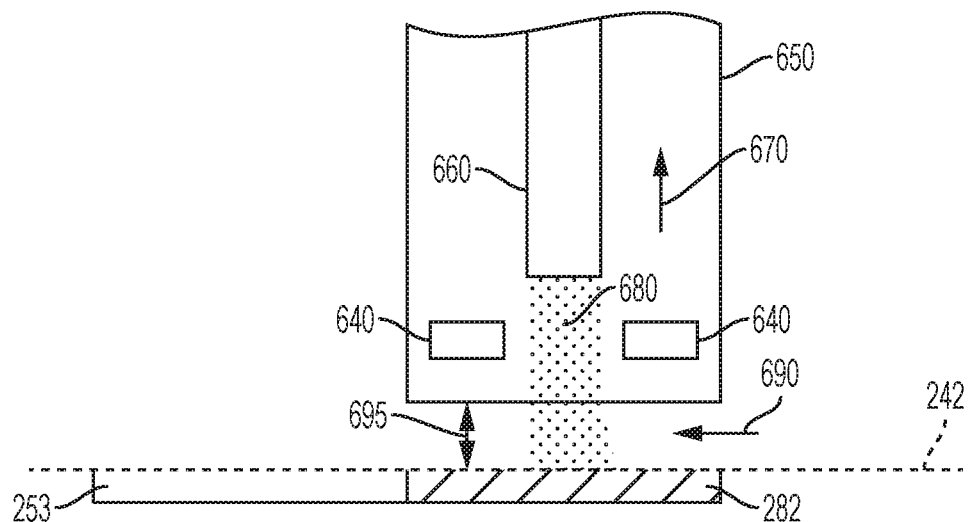
FIG. 3E shows a close-up view of chemical vapor deposition of a second material at the build surface, according to a second embodiment of the present disclosure.

FIG. 3E shows the clearance 695 between enclosure 650 and the build surface according to one embodiment of the present disclosure. CVD process gas 680 exiting gas nozzle 660 decomposes and deposits on the build surface to form second material 282; in some aspects, decomposition may be facilitated by an electromagnetic field generated by arc electrodes 640. The small clearance 695 existing between the bottom of the enclosure 650 and the build surface allows clearance for motion of CVD unit 280 as well as for the inert gas flowing 690 through the build environment to sweep away unreacted CVD process gas 680. In some aspects, clearance 695 is minimized to minimize leakage of unreacted CVD process gas out of enclosure 650 into the build chamber of apparatus 240. For this reason, it may be advantageous that the positioning unit 283 is operable to further move and position the CVD unit 280 in a third direction (e.g. as indicated by the arrow "Z" in FIG. 3D). In addition, unreacted CVD process gas may escape via path 670 and out the gas outlet tube 622. In some aspects, removal of unreacted CVD process gas via the gas outlet tube 622 may be facilitated by a vacuum pump and/or a cold trap to condense vapors.

In another embodiment, the apparatus 240 can be operated with no clearance between enclosure 650 and the build surface, such as to provide a vacuum environment for a vacuum CVD method or to minimize leakage of unreacted CVD process gas out of enclosure 650 into the build chamber of additive manufacturing apparatus 240.

In some embodiments, the mechanism for fusing the build material is binder jetting, in which a binder material is applied to selected regions or a powder material to produce a layer of bonded powder material at the selected regions. In such embodiments, the mechanism for fusing the build material may include spraying the build material with a binder material. In such embodiments, the apparatus for additive manufacturing includes a mechanism for fusing the build material by binder jetting, such as but not limited to a binder material spray nozzle, either in addition to or in place of an energy source. Binder jetting according to the present disclosure may be carried out using any suitable methods, materials, and/or apparatuses known in the art, including but not limited to those disclosed in U.S. Patent Application Publication No. 2002/0106412 and U.S. Pat. No. 5,387,380. Each of these references is incorporated herein by reference in its entirety.

The methods and systems described herein may be used with any build material suitable for use in additive printing, as will be known to those of ordinary skill in the art. In some aspects, the build material is a metal powder. In some aspects, the build material is cobalt chrome. In some aspects, the build material is a polymer, a ceramic slurry, metallic slurry, or a metal powder. In some aspects, the polymer is a powdered polymer.

The methods and systems of the present disclosure may be used in conjunction with additive printing methods known in the art, including, but not limited to direct metal laser melting (DMLM), fused deposition modeling (FDM), stereolithography (SLA), selective laser melting (SLM), binder jetting, and powder-based processes. In some embodiments, the present disclosure is related to a method of fabricating an object using DMLM. In some aspects, the methods and systems of the present disclosure may be used in conjunction with DMLM methods comprising building at least one layer of a chamber wall, providing a layer of powder within the at least one layer of a chamber wall by passing a recoater arm over the layer of powder, irradiating the layer of powder to form a fused region, and then repeating until the object is formed within the chamber wall. The following patent applications include disclosure of these various aspects and their use:

U.S. patent application Ser. No. 15/406,467, titled "Additive Manufacturing Using a Mobile Build Volume," and filed Jan. 13, 2017.

U.S. patent application Ser. No. 15/406,454, titled "Additive Manufacturing Using a Mobile Scan Area," and filed Jan. 13, 2017.

U.S. patent application Ser. No. 15/406,444, titled "Additive Manufacturing Using a Dynamically Grown Build Envelope," and filed Jan. 13, 2017.

U.S. patent application Ser. No. 15/406,461, titled "Additive Manufacturing Using a Selective Recoater," and filed Jan. 13, 2017.

U.S. patent application Ser. No. 15/406,471, titled "Large Scale Additive Machine," and filed Jan. 13, 2017.

The disclosures of these applications are incorporated herein in their entirety to the extent that they disclose additional aspects of additive manufacturing methods and apparatuses that can be used in conjunction with those disclosed herein.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

The invention claimed is:

1. A method for fabricating an object, comprising:
   (a) spreading a layer of build material over a build surface in a build chamber with a recoater mechanism movable in a first dimension;
   (b) fusing at least a portion of the layer of build material in the build chamber to form at least one fused region;
   (c) spreading a subsequent layer of build material with the recoater mechanism over the build surface;
   (d) repeating steps (b) and (c) until the object is formed; and
   (e) at least one step of depositing a second material by chemical vapor deposition during forming the object, wherein at step (e) a vapor is released, and depositing the second material includes containing the vapor and releasing the vapor adjacent to the build surface, wherein the depositing the second material is performed using a chemical vapor deposition unit attached to the recoater mechanism and movable in a second dimension different from the first dimension, wherein the chemical vapor deposition unit is movable independently of a movable fusing mechanism used to form the at least one fused region, wherein the chemical vapor deposition unit comprises an enclosure within the build chamber and a gas nozzle housed within the enclosure, wherein the vapor is released at no more than 2 cm from the build surface, and wherein releasing the vapor adjacent to the build surface comprises depositing the second material from the gas nozzle extending in a downward direction toward the build surface from an actuator and away from a gas inlet in the downward direction.

2. The method of claim 1, wherein fusing at least a portion of a given layer of build material comprises solidifying the build material.

3. The method of claim 2, wherein solidifying the build material comprises fusing a metal powder.

4. The method of claim 2, wherein solidifying the build material comprises polymerizing the build material.

5. The method of claim 2, wherein the solidifying uses a laser source.

6. The method of claim 2, wherein the solidifying uses an electron beam source.

7. The method of claim 1, wherein the fusing at least a portion of the given layer of build material comprises binder jetting the build material.

8. The method of claim 1, wherein the build material is a polymer, a ceramic slurry, metallic slurry, or a metal powder.

9. The method of claim 1, wherein the second material is more opaque to x-ray radiation, more opaque to radioactivity, has a different absorbance energy measured by computed tomography (CT) scanning, has different mechanical wear properties, has greater corrosion resistance, has different infrared (IR) emissivity, has different IR absorptivity or reflectivity, has different ultraviolet (UV) absorptivity or reflectivity, has a different secondary x-ray emission energy profile, has a different neutron scattering profile, has a different surface energy, has a different coefficient of friction, has a different thermal conductivity, has different acoustic propagation properties, has different fatigue resistance, has different wear resistance, has different tribology, has different electrical conductivity, or has different surface properties than the build material in the at least one fused region.

10. The method of claim 1, wherein the second material has a different density than the build material in the at least one fused region.

11. The method of claim 1, wherein the second material is deposited by plasma-enhanced chemical vapor deposition; and wherein the plasma is generated and/or strengthened by at least one selected from two or more arc electrodes, a helical resonator, or an electron cyclotron resonance plasma reactor.

12. The method of claim 1, wherein depositing a second material by chemical vapor deposition during or after forming the object comprises depositing the second material from a chemical vapor deposition unit attached to a recoater arm.

13. A method for fabricating an object, comprising:
(a) spreading a layer of build material over a build surface in a build chamber with a recoater mechanism movable in a first dimension;
(b) fusing at least a portion of the layer of build material in the build chamber to form at least one fused region;
(c) spreading a subsequent layer of build material with the recoater mechanism over the build surface;
(d) repeating steps (b) and (c) until the object is formed; and
(e) at least one step of depositing an identifying chemical marker within the object using chemical vapor deposition during forming the object, wherein at step (e) a vapor is released, and depositing the identifying chemical marker includes containing the vapor and releasing the vapor adjacent to the build surface, wherein the depositing the identifying chemical marker is performed using a chemical vapor deposition unit attached to the recoater mechanism and movable in a second dimension different from the first dimension, wherein the chemical vapor deposition unit is movable independently of a movable fusing mechanism use to form the at least one fused region, wherein the chemical vapor deposition unit comprises an enclosure within the build chamber and a gas nozzle housed within the enclosure, wherein the vapor is released at no more than 2 cm from the build surface, and wherein releasing the vapor adjacent to the build surface comprises depositing the identifying chemical marker from the gas nozzle extending in a downward direction toward the build surface from an actuator and away from a gas inlet in the downward direction.

14. The method of claim 13, wherein the identifying chemical marker is different from the build material.

15. The method of claim 13, wherein the vapor is contained or released at no more than 2 cm from the build surface where the build material is provided.

16. The method of claim 13, wherein the identifying chemical marker is deposited by plasma-enhanced chemical vapor deposition; and wherein the plasma is generated and/or strengthened by at least one selected from two or more arc electrodes, a helical resonator, or an electron cyclotron resonance plasma reactor.

17. The method of claim 13, wherein the identifying chemical marker has a different density than the build material in the at least one fused region.

18. The method of claim 13, wherein the identifying chemical marker is a contrast agent.

19. The method of claim 13, wherein the identifying chemical marker is more opaque to x-ray radiation than the build material in the at least one fused region.

20. The method of claim 13, wherein the identifying chemical marker is identifiable by spectroscopic or imaging methods.

* * * * *